(12) United States Patent
Tappan et al.

(10) Patent No.: US 11,278,960 B1
(45) Date of Patent: Mar. 22, 2022

(54) ADDITIVELY MANUFACTURED METAL ENERGETIC LIGAND PRECURSORS AND COMBUSTION SYNTHESIS

(71) Applicant: Triad National Security, LLC, Los Alamos, NM (US)

(72) Inventors: Bryce Tappan, Santa Fe, NM (US); Andrew Schmalzer, Los Alamos, NM (US); Alexander Mueller, Santa Fe, NM (US)

(73) Assignee: Triad National Security, LLC, Los Alamos, NM (US)

( * ) Notice: Subject to any disclaimer, the term of this patent is extended or adjusted under 35 U.S.C. 154(b) by 410 days.

(21) Appl. No.: 16/381,074

(22) Filed: Apr. 11, 2019

Related U.S. Application Data (60) Provisional application No. 62/656,510, filed on Apr. 12, 2018.

(51) Int. Cl.
    *B22F 3/11* (2006.01)
    *C22C 1/08* (2006.01)
    *B22F 10/00* (2021.01)
    *B22F 10/60* (2021.01)
    *H05K 1/09* (2006.01)
    *C09D 11/52* (2014.01)

(52) U.S. Cl.
    CPC ............ *B22F 3/1121* (2013.01); *B22F 10/00* (2021.01); *B22F 10/60* (2021.01); *C09D 11/52* (2013.01); *C22C 1/08* (2013.01); *H05K 1/092* (2013.01); *B22F 2998/00* (2013.01)

(58) Field of Classification Search
    CPC ........ B22F 3/1121; B22F 10/00; B22F 10/60; B22F 2998/00; C09D 11/52; C22C 1/08; H05K 1/092
    See application file for complete search history.

(56) References Cited

U.S. PATENT DOCUMENTS

| | | | |
|---|---|---|---|
| 7,141,675 B2 | 11/2006 | Tappan et al. | |
| 2006/0078454 A1* | 4/2006 | Tappan | B22F 3/1121 419/1 |

OTHER PUBLICATIONS

Jennifer A. Lewis, Direct Ink Writing of 3D Functional Materials, Adv. Funct. Mater. 2006, 16, 2193-2204 (Year: 2006).*
Brittany Branch et al., "Controlling shockwave dynamics using architecture in periodic porous materials," Journal of Applied Physics 121, 135102 (2017).
Bryce Tappan et al., "Nanoporous Metal Foams," Angew. Chem. Int. Ed. 49, pp. 4544-4565 (2010).

(Continued)

*Primary Examiner* — Rebecca Janssen
(74) *Attorney, Agent, or Firm* — LeonardPatel PC; Michael A. Leonard, II; Sheetal S. Patel (57) ABSTRACT

Processes for tailoring the macroscopic shape, metallic composition, mechanical properties, and pore structure of nanoporous metal foams prepared through combustion synthesis via direct write 3D printing of metal energetic ligand precursor inks made with water and an organic thickening agent are disclosed. Such processes enable production of never before obtainable metal structures with hierarchical porosity, tailorable from the millimeter size regime to the nanometer size regime. Structures produced by these processes have numerous applications including, but not limited to, catalysts, heat exchangers, low density structural materials, biomedical implants, hydrogen storage medium, fuel cells, and batteries.

7 Claims, 7 Drawing Sheets

530

(56) References Cited

OTHER PUBLICATIONS

Bryce Tappan et al., "Ultralow-Density Nanostructured Metal Foams: Combustion Synthesis, Morphology, and Composition," J. Am. Chem. Soc. 128, pp. 6589-6594 (2006).
Debora Ressnig et al., "Ultrafast Syntheses of Silver Foams from Ag2NCN: Combustion Synthesis versus Chemical Reduction," Chem. Mater. 26, pp. 4064-4067 (2014).
Devendra Pakhare et al., "A review of dry (CO2) reforming of methane over noble metal catalysts," Chem. Soc. Rev., 43, pp. 7813-7837 (2014).
Eric B. Duoss et al., "Three-Dimensional Printing of Elastomeric, Cellular Architectures with Negative Stiffness," Adv. Funct. Mater. 24, pp. 4905-4913 (2014).
Jennifer A. Lewis, "Direct Ink Writing of 3D Functional Materials," Adv. Funct. Mater. 16, pp. 2193-2204 (2006).
Jonah Erlebacher et al., "Evolution of Nanoporosity in Dealloying," Nature 410, 450 (Mar. 22, 2001) (manuscript version differs slightly from the final published version).
Shannon L. Taylor et al., "Iron and Nickel Cellular Structures by Sintering of 3D-Printed Oxide or Metallic Particle Inks," Advanced Engineering Materials 19, No. 11, 1600365, pp. 1-8 (2017).

\* cited by examiner

ADDITIVELY MANUFACTURED METAL ENERGETIC LIGAND PRECURSORS AND COMBUSTION SYNTHESIS

CROSS-REFERENCE TO RELATED APPLICATION

This application claims the benefit of U.S. Provisional Patent Application No. 62/656,510 filed Apr. 12, 2018. The subject matter of this earlier-filed application is hereby incorporated by reference in its entirety.

STATEMENT OF FEDERAL RIGHTS

The United States government has rights in this invention pursuant to Contract No. 89233218CNA000001 between the United States Department of Energy and Triad National Security, LLC for the operation of Los Alamos National Laboratory.

FIELD

The present invention generally relates to metal foams, and more particularly, to processes for tailoring the macroscopic shape, metallic composition, mechanical properties, and pore structure of nanoporous metal foams prepared through combustion synthesis via direct write three-dimensional (3D) printing of metal energetic ligand precursor inks made with water and/or one or more organic thickening agents.

BACKGROUND

Figure 1:
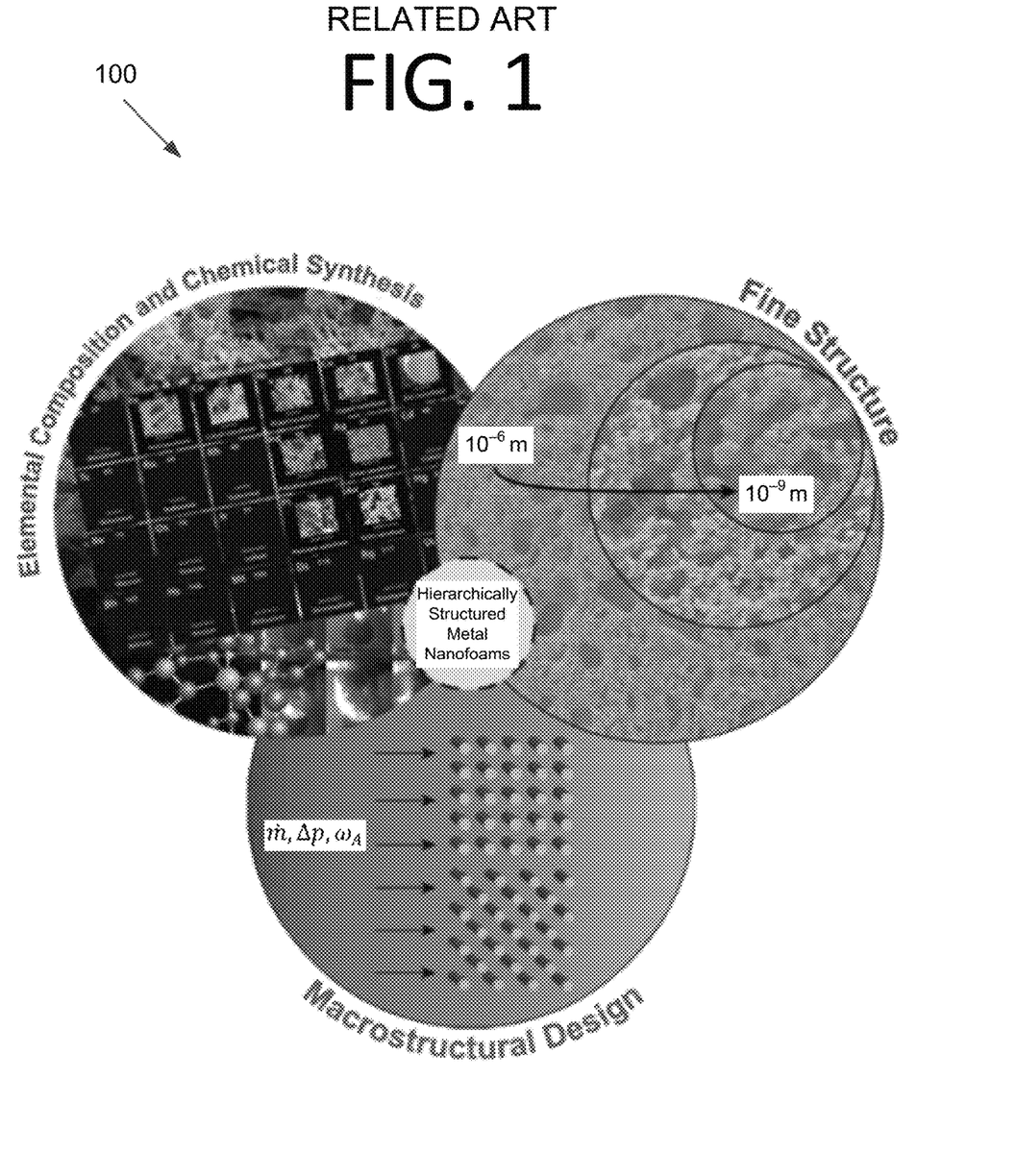
FIG. 1 illustrates the nexus of chemistry, nanostructure, and macrostructure presented by MNFs.
Figure 2:
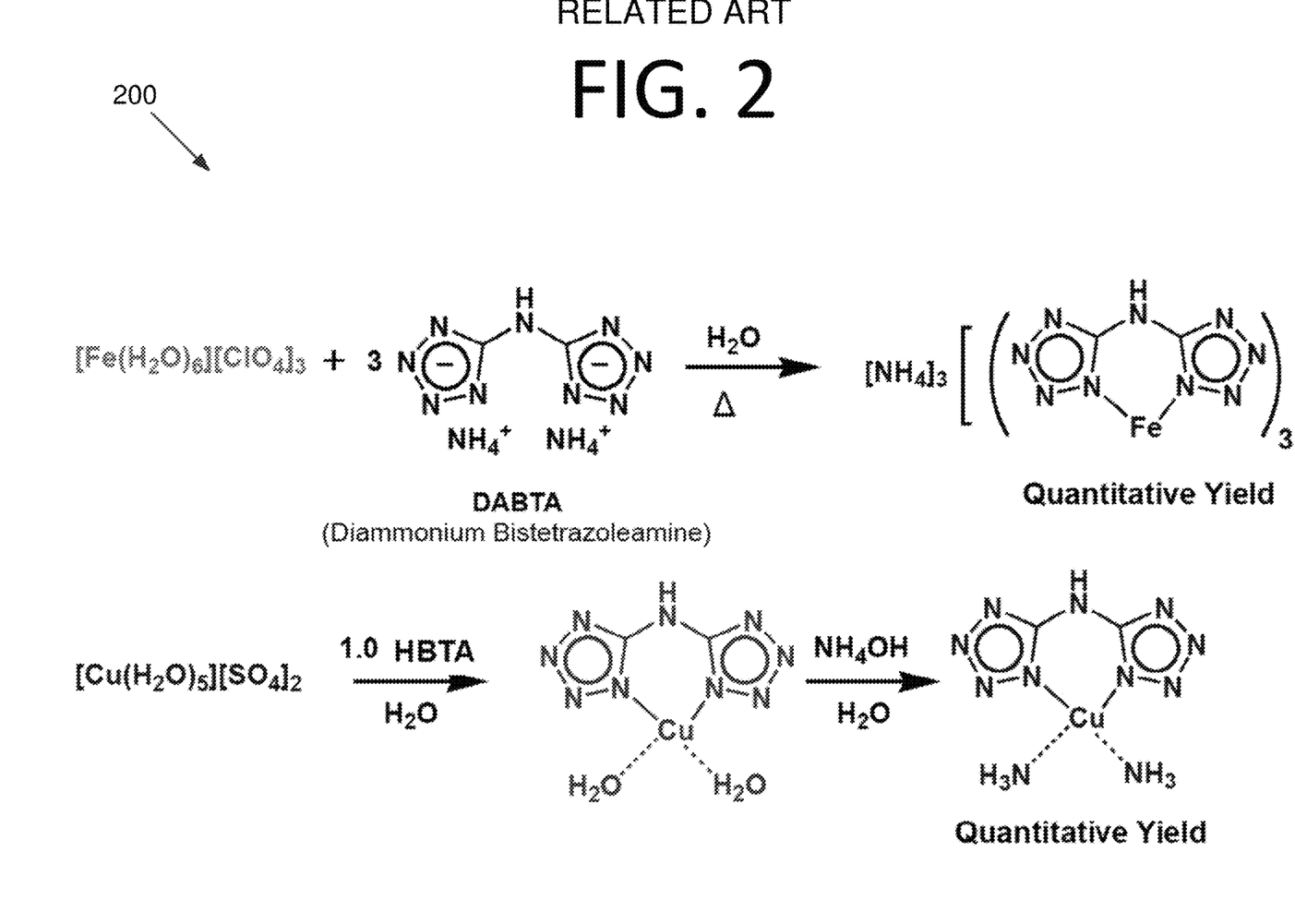
FIG. 2 illustrates chemical reactions for producing $[Fe(BTA)_3][NH_4]_3$ and $Cu(BTA)(NH_3)_2$.

Nanoporous metal foams (NMFs) are a class of advanced porous architectures that combine metallic compositions with macroporosity, mesoporosity, and sub-micron microporosity typical of sol-gel-derived pore networks. NMFs thus present a nexus of chemistry, nanostructure, and macrostructure. See image 100 of FIG. 1. The elemental composition can be variable and allows for applications in structural materials, hydrogen storage, heat transfer, catalysts, etc. The fine structure dictates catalytic activity, surface area/kinetics, etc. The macrostructure allows for the engineering, design, and control of flow paths and pressure drop. Development of processes for controlling porosity over nano-length, micro-length, and macro-length scales and strategies for controlling monolithicity will be important for maximizing the potential of NMFs for technological applications. Chemical reactions 200 for producing $[Fe(BTA)_3][NH_4]_3$ and $Cu(BTA)(NH_3)_2$ are shown in FIG. 2.

However, while a handful of metals, such as gold, can be readily rendered into nanoporous foams through dealloying techniques, the porosity and morphology of such foams is limited in scope, and this dealloying does not extend well to most transition and main-group metals. Combustion synthesis to produce metal foams using metal bistetrazoleamine (mBTA) complexes, for example, is a straightforward process for preparing aerogel-like densities and open-celled pore networks of a wide variety of metals. However, one primary disadvantage of the combustion synthesis approach to date has been the difficulty in producing the foam material in relevant form factors, thus limiting applications where macroscopic forms and shape control are desired. Accordingly, an improved process for producing metal foams may be beneficial.

SUMMARY

Certain embodiments of the present invention may provide solutions to the problems and needs in the art that have not yet been fully identified, appreciated, or solved by conventional metal foam synthesis techniques. For example, some embodiments of the present invention pertain to processes for tailoring the macroscopic shape, metallic composition, mechanical properties, and pore structure of nanoporous metal foams prepared through combustion synthesis via direct write 3D printing of metal energetic ligand precursor inks made with water and/or an organic thickening agent.

In an embodiment, a method for producing nanoporous metal foam includes direct write 3D printing a metal energetic ligand precursor ink by extruding the metal energetic ligand precursor ink into a printed structure and allowing the printed structure to dry, producing the nanoporous metal foam. The printed structure exhibits porosity at a macro structural scale.

In another embodiment, an additive manufacturing process for producing hierarchically structured nanoporous metal foam includes extruding a slurry including one or more metal energetic ligand precursors into a structure with a prescribed pattern and density. The process also includes heating the structure in an inert atmosphere such that the one or more metal energetic ligand precursors of the structure undergo self-sustaining combustion synthesis that transforms the one or more energetic metal ligand precursors into a foaming gas, leaving behind a zero-valence state metal. The process further includes heat treating the structure to strengthen the structure and produce a post-processed structure. In some embodiments, only the post-processing is performed at a temperature higher than room temperature.

In yet another embodiment, a process includes 3D printing a metal energetic ligand precursor ink by extruding the metal energetic ligand precursor ink into a structure and allowing the printed structure to dry, producing a nanoporous metal foam. The metal energetic ligand precursor ink is a slurry that includes one or more metal energetic ligands, as well as water, at least one binder, or both. The one or more metal energetic ligand precursors include mBTA, metal cyanimide, metal dicyanamide, metal 5-aminotetrozole, or any combination thereof. The process also includes heating the structure in an inert atmosphere such that the one or more metal energetic ligand precursors of the structure undergo self-sustaining combustion synthesis. The process further includes heat treating the structure to strengthen the structure and produce a post-processed structure. The metal energetic ligand precursor ink comprises a slurry of the one or more metal energetic ligand precursors, water, and at least one binder, or the metal energetic ligand precursor ink comprises a slurry of the one or more metal energetic ligand precursors and at least one binder.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

Some embodiments of the present invention pertain to processes for tailoring the macroscopic shape, metallic composition, mechanical properties, and pore structure of nanoporous metal foams prepared through combustion synthesis via direct write 3D printing of metal energetic ligand precursor inks made with water and/or an organic thickening agent. The energetic ligands may include, but are not limited to, BTA, cyanimide, dicyanamide, 5-aminotetrozole, any other suitable energetic ligand, or any combination thereof without deviating from the scope of the invention. The energetic ligands are prepared with a metal (e.g., [Fe(BTA)$_3$][NH$_4$]$_3$, Cu(BTA)(NH$_3$)$_2$, silver cyanimide, etc.), which constitutes the metal(s) in the NMF.

These combined technologies from Los Alamos National Laboratory (LANL) enable production of never before obtainable metal structures with hierarchical porosity, tailorable from the millimeter size regime to the nanometer size regime. Such hierarchical structures could prove to be revolutionary flow catalysts. Additionally, the conductive metal substrate may be utilized for electro-catalyst structures. These structures have numerous applications including, but not limited to, catalysts, heat exchangers, low density structural materials, biomedical implants, hydrogen storage medium, fuel cells, and batteries.

Combustion conditions, incorporation of binders into pre-combustion structures, and post-synthesis annealing on pore size statistics and molar surface areas are discussed. Compressive strength and modulus as a function of these conditions are characterized and analyzed via micro- and nano-computed tomography (CT). Hierarchical structures of NMFs are produced with various macrostructures (e.g., grids in simple cubic and face centered cubic patterns) with foam structures consisting of microporosity and nanoporosity. Potential for using NMFs with enhanced mechanical properties and form factors is discussed herein in an effort to show how additive manufacturing and combustion synthesis can produce unique and difficult to obtain hierarchical porous architectures.

Hierarchical nanoporous and microporous metals with blended constituents cannot be made with conventional 3D printing processes. Accordingly, some embodiments employ a novel process for manipulating the macroscopic form factors of metal foams, while retaining the nanostructure and high surface area (e.g., 10 to 260 m$^2$ g$^{-1}$) intrinsic to the combustion synthesis process of mBTA, metal cyanimide, metal dicyanamide, metal 5-aminotetrozole, etc., to produce hierarchically structured nanoporous metal foams (HS-NMFs). In contrast to current technology for metal 3D printing that requires expensive laser melting of powder beds or filaments, the processing of some embodiments is conducted at room temperature with a lower profile process (e.g., a lightly modified conventional 3D printer), where only the post-processing is done at a higher temperature. This is a key and ground-breaking aspect of some embodiments because it allows the user to print metallic structures at room temperature, as well as to be able to incorporate small stochastic pore size (e.g., less than 1 μm) and large controlled pore size (e.g., greater than 250 μm) into the same structure. Neither of these features have been previously demonstrated.

With this new capability, methods for tailoring the macroscopic shape, mechanical properties, and pore structure of NMFs prepared through combustion synthesis are provided via 3D printing of metal energetic ligand precursor inks made with water and an organic rheology modifier. One of the distinct advantages of the process for making metallic foams of some embodiments is that in the course of making the printable formulation, multiple metal energetic ligand precursors can be combined in the same ink, allowing for composite metallic foams. This will allow the deposition of higher catalytic activity metals (e.g., Pt, Pd, Re, etc.) in an efficient but disperse format throughout a lower catalytic activity and/or higher compressive strength matrix (e.g., Cu or Ni).

Additionally, 3D printed structured metals have the ability to withstand high elastic strain by distributing applied stresses throughout the linkages that make up the macrostructure, which could improve the lifetime of these materials under hydrodynamic stresses that occur in flow cells. This inexpensive, rapid, and novel capability would be of interest to fuel cell, carbon capture, reactive metal, hydrogen storage, and heterogeneous catalysis programs. On the federal side, the U.S. Department of Defense (DoD) and the Department of Energy (DOE) Office of Energy Efficiency and Renewable Energy (EERE) have various programs that this novel capability would benefit.

Figure 3A:
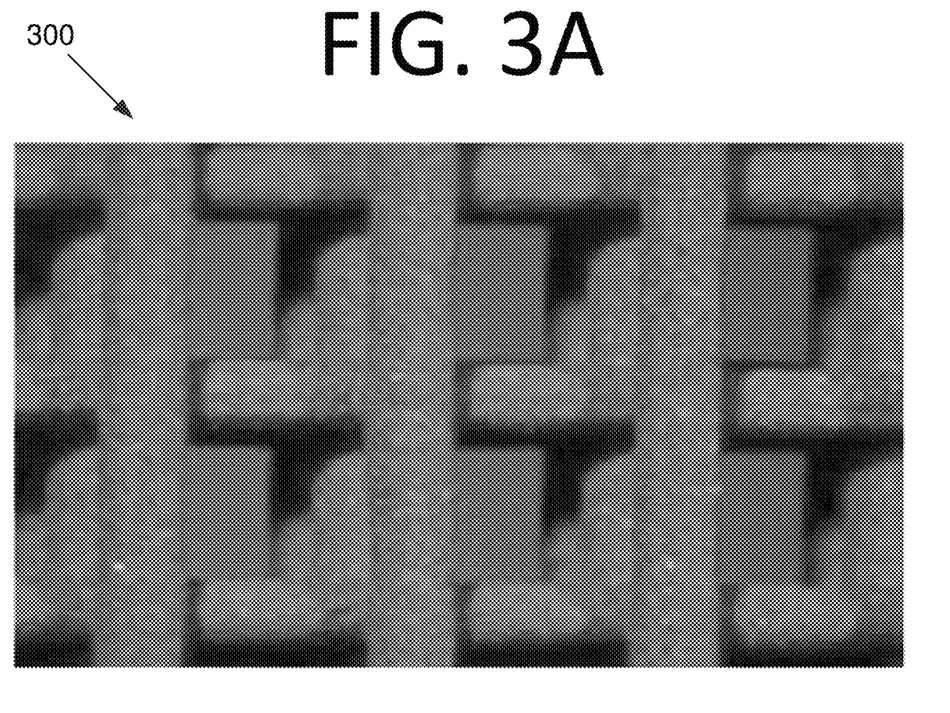
FIG. 3A is a magnified view of a simple cubic patterned macrostructure, according to an embodiment of the present invention.
Figure 3B:
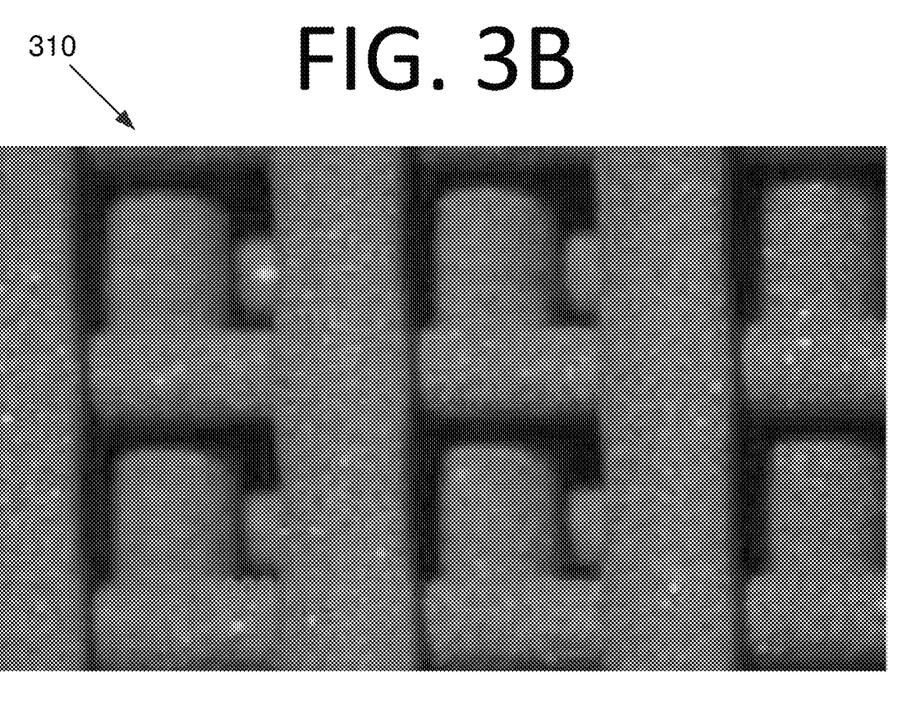
FIG. 3B is a magnified view of a face centered tetragonal patterned macrostructure, according to an embodiment of the present invention.

The strategy for producing HS-NMFs in some embodiments is centered around the concatenation of an additive manufacturing (AM) process to the front end of the combustion synthesis technique already established for generating NMFs. Through AM, various macrostructures (e.g., grids in cubic and face centered tetragonal patterns; see magnified images 300, 310 of FIGS. 3A and 3B, respectively) can be designed using a new mBTA feedstock that retains the structural framework consisting of microporous and nanoporous foam generated after combustion synthesis.

Generally speaking, the process of some embodiments includes pressing or printing an energetic organometallic complex into the desired architecture. The structure is then ignited by contacting it with a hot wire or laser, for example. This causes the complex to combust, releasing metal centers, heat, and combustion gases (mostly $H_2/N_2$ in some embodiments). The metal centers reduce to a zero-valency agglomerate of nanoparticles, and the $H_2/N_2$ blows the foam in a manner somewhat analogous to a Fourth of July carbon snake, but with metal.

Pressed pellets of Fe(BTA) may be used, which are the lowest density metal foams yet discovered (0.011 g/cm$^3$). Fe(BTA) also has a high surface area (270 m$^2$ g$^{-1}$). This surface area is comparable to ultra-high surface area aerogels.

Figure 4:
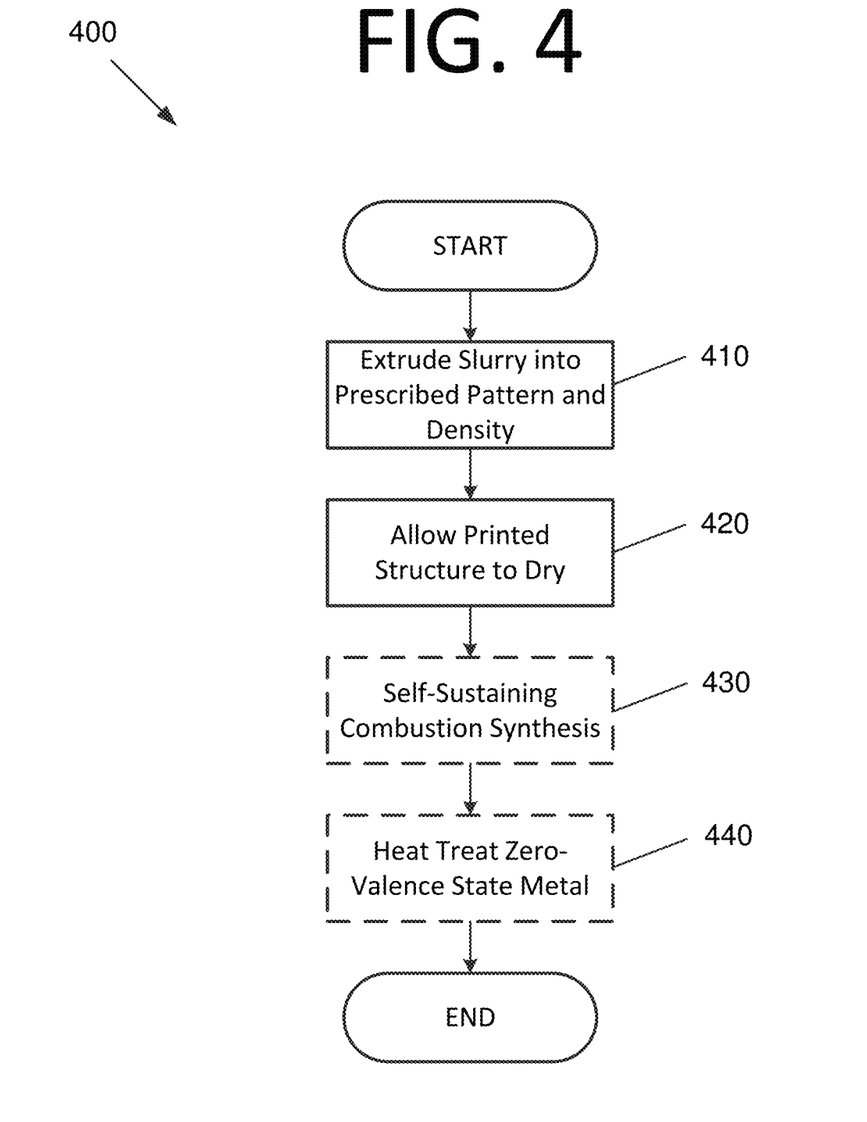
FIG. 4 is a flowchart illustrating a process for generating additively manufactured HS-NMFs, according to an embodiment of the present invention.
Figure 5A:
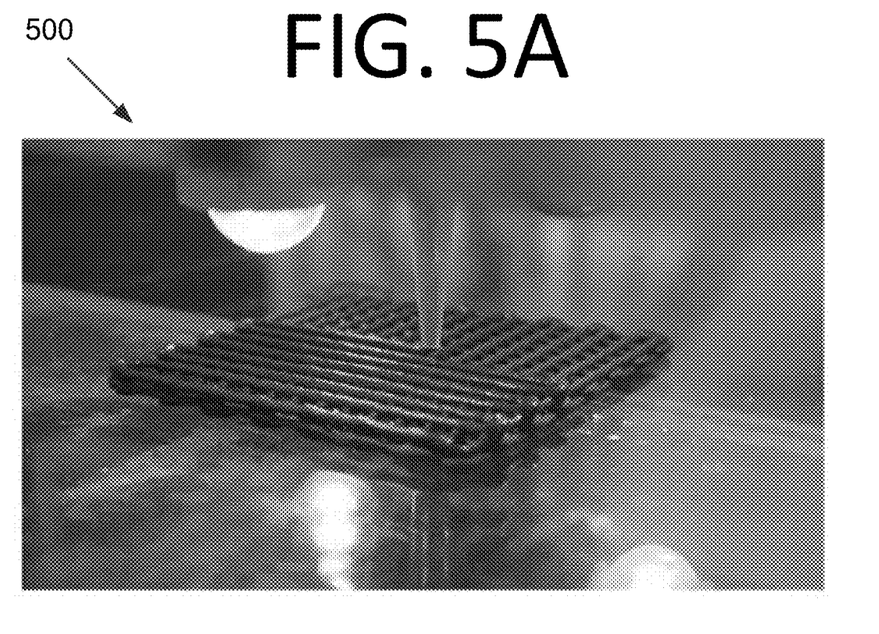
FIG. 5A is a photograph illustrating a 3D printer extruding a water-based slurry of mBTA precursors, according to an embodiment of the present invention.

FIG. 4 is a flowchart illustrating a process 400 for generating additively manufactured HS-NMFs, according to an embodiment of the present invention. The process begins with extruding a water-based slurry "ink" including at least one metal energetic ligand precursor (see image 500 of FIG. 5A) into a structure with a prescribed pattern and density at 410. See also images 300, 310 of FIGS. 3A and 3B. In some embodiments, multiple inks having different chemical structures and/or metals may be used. For instance, an mBTA ink using copper and an mBTA ink using titanium may be combined.

A suitable binder, such as methyl cellulose, may be used to gel the water in the slurry to cause it to hold its shape as the slurry is extruded. Methyl cellulose, for example, serves as binder once the water dries. However, other cellulose and non-cellulose binders may be used without deviating from the scope of the invention. Such cellulose and non-cellulose binders may include, but are not limited to, ethyl cellulose, butyl cellulose, hydroxypropyl methyl cellulose, hydroxypropyl methyl cellulose, hydroxypropyl cellulose, hydroxyethyl cellulose, carboxymethylcellulose, methylethylcellulose, ethyl hydroxyethyl cellulose, hydroxypropyl methyl cellulose, and/or other polysaccharides, such as xanthan gum. In some embodiments, multiple cellulose binders, multiple non-cellulose binders, or at least one cellulose binder and at least one non-cellulose binder may be used. Furthermore, organic solvents may be used in place of water in some embodiments, and a suitable organic-soluble binder combination may be used. Combinations that provide high viscosity with a low binder content are preferable in some embodiments. Examples include, but are not limited to, acetone, methyl acetate, ethyl acetate, and butyl acetate, with cellulose esters such as cellulose nitrate, cellulose acetate, and cellulose acetatebutyrate. Organic solvents can be useful when the metal energetic ligand precursor(s) exhibit high water solubility, particularly, but not exclusively, when m=Fe, Co, Ni, or V.

The metal energetic ligand precursor(s) may be [Fe(BTA)$_3$][NH$_4$]$_3$, Cu(BTA)(NH$_3$)$_2$, metal cyanimide, metal dicyanamide, metal 5-aminotetrozole, and/or any other suitable metal energetic ligand precursor without deviating from the scope of the invention. Also, any metal may be used. Any combination or ratio of suitable metal energetic ligand precursors can be incorporated into a powder precursor fraction of a single formulation in some embodiments without deviating from the scope of the invention. However, copper is relatively inexpensive and easy to work with, so Cu(BTA)(NH$_3$)$_2$, for instance, is suitable and cost-effective for many applications. Cu(BTA) also provides structure-controlled macroporosity with stochastic nanoporosity.

The 3D printer may be a direct ink write (DIW) printer in some embodiments with a suitable nozzle size (e.g., 400 μm). A complex rheology may be employed to retain metal energetic ligand precursor shape while drying. Yield stress behavior may allow for the spanning of large gaps to increase the porosity.

Figure 5B:
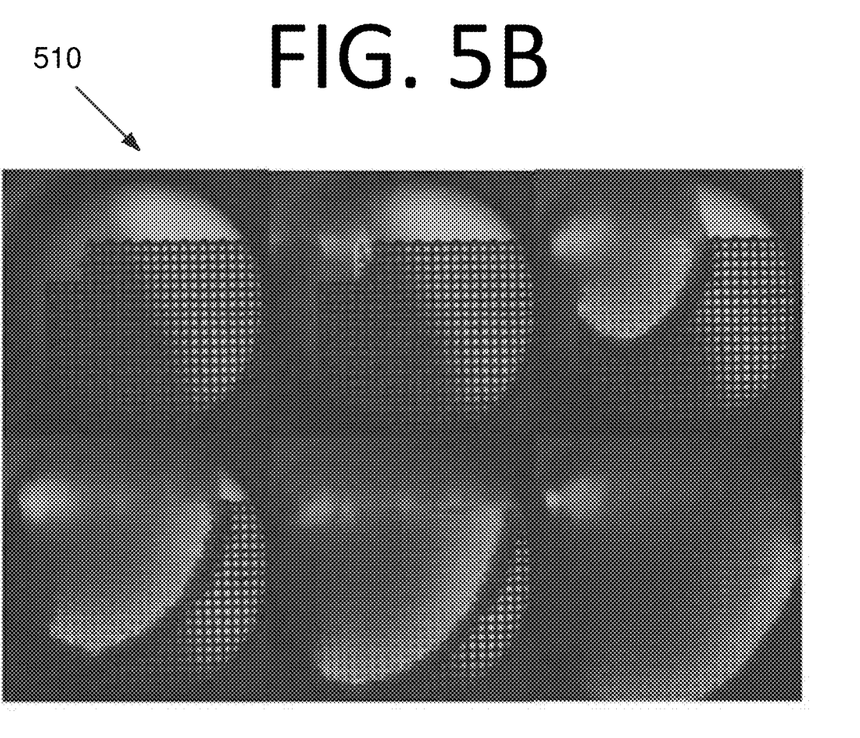
FIG. 5B is a photograph illustrating the printed mBTA precursors undergoing a self-sustaining combustion synthesis via input from a $CO_2$ laser, according to an embodiment of the present invention.
Figure 5C:
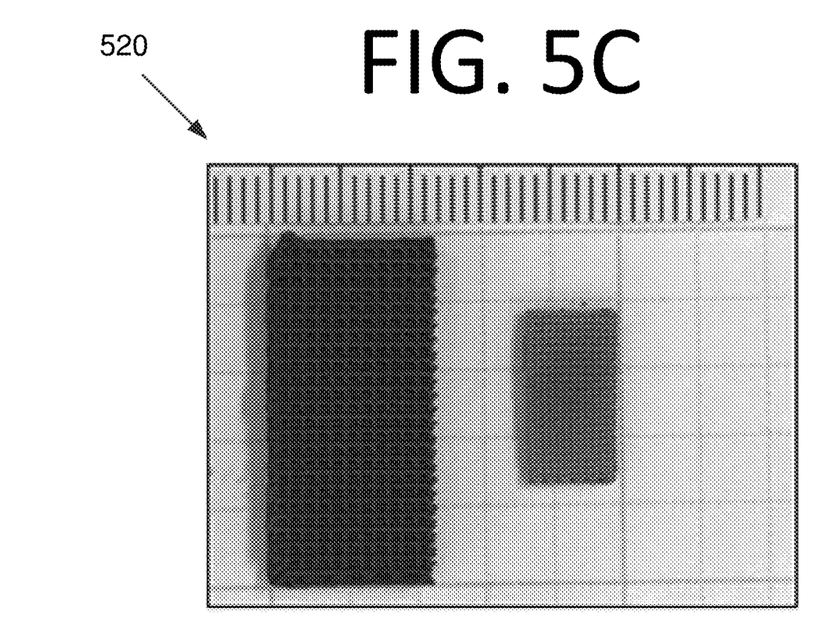
FIG. 5C is a photograph illustrating zero-valence state metal structures before (left) and after (right) heat treatment, according to an embodiment of the present invention.

The printed structure is allowed to dry at 420. In some embodiments, this is the last step and the nanoporous metal foam is produced via reactions within the ink. However, in other embodiments, the process continues. The metal energetic ligand precursor(s) of the printed structure undergo a self-sustaining combustion synthesis via input from a $CO_2$ laser (see image 510 of FIG. 5B) in a high-pressure inert atmosphere at 420 that transforms the ligand(s) into a foaming gas. In image 510, the transformation progressively occurs from the upper left to the lower right. This leaves behind a zero-valence state metal. See the left metal structure in image 520 of FIG. 5C. The zero-valence state metal undergoes further heat treatment at 430 to strengthen the remaining structure. See the right metal structure in image 520 of FIG. 5C. Both reactive and inert atmospheres can be used in both combustion and post-processing in some embodiments to provide reducing environments or oxidizing environments. Post-processing can also be performed in a reduced pressure environment in some embodiments.

Figure 5D:
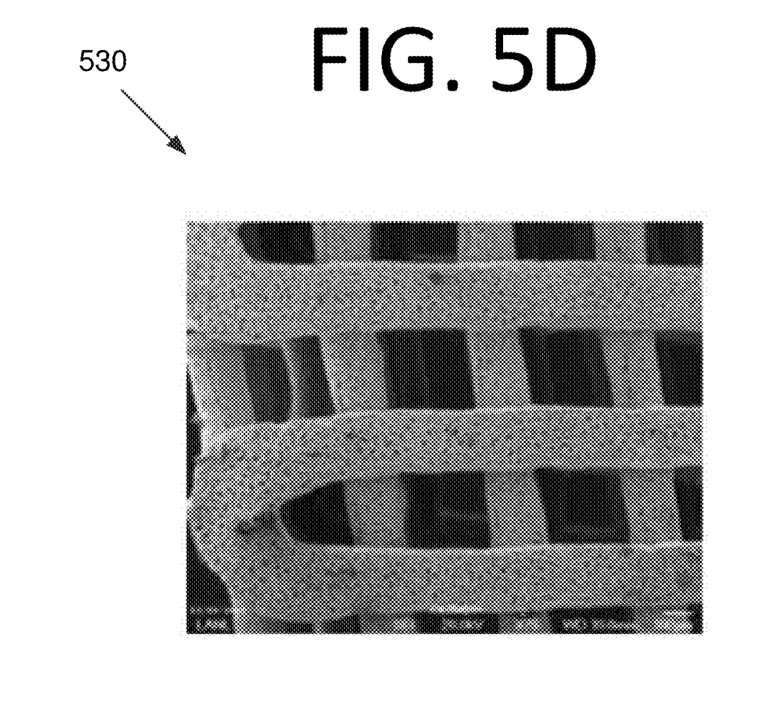
FIG. 5D is a micrograph illustrating a post-processed structure at a 300 μm scanning electron microscope (SEM) scale, according to an embodiment of the present invention.
Figure 5E:
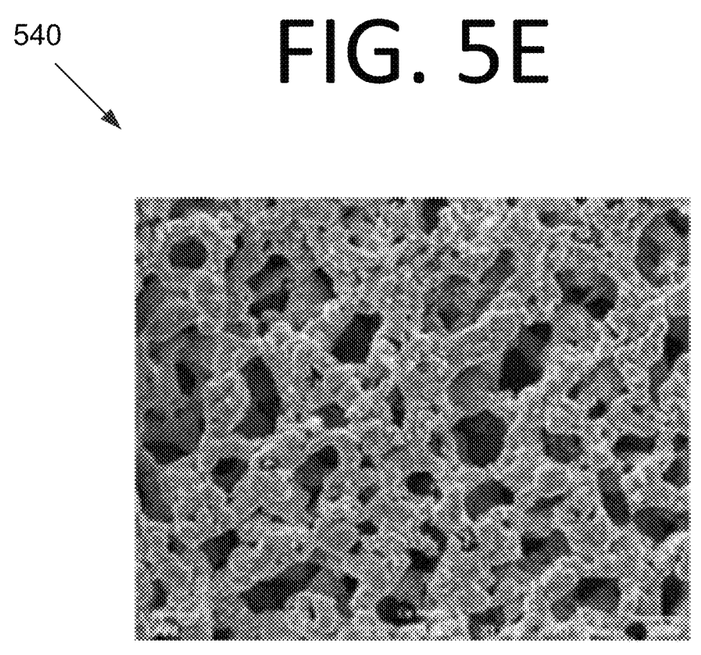
FIG. 5E is a micrograph illustrating a post-processed structure at a 20 μm SEM scale, according to an embodiment of the present invention.

The post-processed structure retains both the macroscale and nanoscale features that make these materials unique. Micrograph 530 of FIG. 5D shows the post-processed structure at the 300 μm scanning electron microscope (SEM) scale and micrograph 540 of FIG. 5E shows the post-processed structure at the 20 μm SEM scale. As can be seen, both structure and porosity are achieved.

Synthesis conditions, such as the annealing under various gaseous environments, flow rates, and temperature profiles, will affect the pore structure and molar surface area. By using Brunauer-Emmett-Teller (BET) analysis, the right balance of compressive strength to pore size/surface area for a given application can be discovered, while limiting sample shrinkage and warpage. By tuning the synthesis conditions, the catalytic properties of the nanofoams can be tuned as a promising catalyst for nanotube and graphene synthesis, generating composite nanostructures with tailored electrical and mechanical properties. Other targeted reactions include the gas-phase, enhanced dry reforming of methane with $CO_2$, a reaction that could be a net negative carbon sink with solar or nuclear energy input.

Mechanical response in compression can be determined using dynamic micro-CT and nano-CT to show how the macrostructure can improve these catalytic materials under load. By studying the relationship between post-processing conditions and structure, the printed materials can be tuned to have surface areas that optimize catalytic activity. Energy-dispersive x-ray spectroscopy (EDS) mapping of the as-processed samples can help to determine the dispersion of various metallic components throughout the HS-NMF matrix. Modifying the mechanical response of metal foams with similar densities via AM is also possible. Producing NMFs with enhanced mechanical properties and form factors via additive manufacturing and combustion synthesis can yield unique and conventionally difficult to obtain hierarchical porous architectures.

Metal nanofoams can be produced for numerous metals, or combinations of metals. Once the desired metal is selected and the metal energetic ligand precursor(s) are produced, a slurry can be formulated and 3D printed using the DIW process. The process employed in some embodiments represents the first time that nanoscale to macroscale feature size has been accomplished.

It will be readily understood that the components of various embodiments of the present invention, as generally described and illustrated in the figures herein, may be arranged and designed in a wide variety of different configurations. Thus, the detailed description of the embodiments of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. An additive manufacturing process for producing hierarchically structured nanoporous metal foam, comprising:
    extruding a slurry comprising one or more metal energetic ligand precursors into a structure with a prescribed pattern and density;
    heating the structure in an inert atmosphere such that the one or more metal energetic ligand precursors of the structure undergo self-sustaining combustion synthesis that transforms the one or more metal energetic ligand precursors into a foaming gas, leaving behind a zero-valence state metal; and
    heat treating the structure to strengthen the structure and produce a post-processed structure.

2. The method of claim 1, wherein only the post-processing is performed at a temperature higher than room temperature.

3. The method of claim 1, wherein the one or more metal energetic ligand precursors comprise metal bistetrazoleamine (mBTA), metal cyanimide, metal dicyanamide, metal 5-aminotetrozole, or any combination thereof.

4. The method of claim 1, wherein
    the nanoporous metal foam is a composite metal foam that comprises a higher catalytic activity metal and a matrix metal that has lower catalytic activity than the higher activity catalytic metal and/or a matrix metal that has higher compressive strength than the higher catalytic activity metal,
    the higher catalytic activity metal comprises Pt, Pd, Re, or any combination thereof, and
    the matrix metal comprises Cu, Ni, or any combination thereof.

5. A process, comprising:
    three-dimensional (3D) printing a metal energetic ligand precursor ink by extruding the metal energetic ligand precursor ink into a structure and allowing the structure to dry, producing a nanoporous metal foam;
    heating the structure in an inert atmosphere such that one or more metal energetic ligand precursors of the structure in the metal energetic ligand precursor ink undergo self-sustaining combustion synthesis, the one or more metal energetic ligand precursors comprising metal bistetrazoleamine (mBTA), metal cyanimide, metal dicyanamide, metal 5-aminotetrozole, or any combination thereof; and
    heat treating the structure to strengthen the structure and produce a post-processed structure, wherein
    the metal energetic ligand precursor ink comprises a slurry of the one or more metal energetic ligand precursors, water, and at least one binder, or
    the metal energetic ligand precursor ink comprises a slurry of the one or more metal energetic ligand precursors and at least one binder.

6. The process of claim 5, wherein
    the nanoporous metal foam is a composite metal foam that comprises a higher catalytic activity metal and a matrix metal that has lower catalytic activity than the higher activity catalytic metal and/or a matrix metal that has higher compressive strength than the higher catalytic activity metal,
    the higher catalytic activity metal comprises Pt, Pd, Re, or any combination thereof, and
    the matrix metal comprises Cu, Ni, or any combination thereof.

7. The process of claim 5, wherein the structure comprises grids in a cubic pattern, a face centered pattern, or both.

* * * * *